United States Patent
Wan

(10) Patent No.: US 8,395,430 B2
(45) Date of Patent: Mar. 12, 2013

(54) DIGITAL PHASE LOCKING LOOP AND METHOD FOR ELIMINATING GLITCHES

(75) Inventor: Chen Wan, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 181 days.

(21) Appl. No.: 13/051,204

(22) Filed: Mar. 18, 2011

(65) Prior Publication Data

US 2011/0163787 A1    Jul. 7, 2011

Related U.S. Application Data

(63) Continuation of application No. PCT/CN2009/072932, filed on Jul. 27, 2009.

(30) Foreign Application Priority Data

Sep. 19, 2008    (CN) .......................... 2008 1 0211585

(51) Int. Cl.
*H03L 7/06*    (2006.01)

(52) U.S. Cl. ......... 327/159; 327/156; 327/150; 375/373

(58) Field of Classification Search .................. 327/150, 327/159

See application file for complete search history.

(56) References Cited

U.S. PATENT DOCUMENTS

| | | | | |
|---|---|---|---|---|
| 6,239,627 B1 * | 5/2001 | Brown et al. | ................. | 327/116 |
| 7,388,414 B1 * | 6/2008 | Pasqualini | .................... | 327/143 |
| 8,072,248 B2 * | 12/2011 | Wan | ............................. | 327/158 |
| 8,174,298 B2 * | 5/2012 | Wan | ............................. | 327/158 |
| 2005/0122152 A1 * | 6/2005 | Yoshida et al. | ............... | 327/285 |

FOREIGN PATENT DOCUMENTS

| | | |
|---|---|---|
| CN | 1150354 A | 5/1997 |
| CN | 1627641 A | 6/2005 |
| CN | 1964189 A | 5/2007 |
| CN | 101369814 A | 2/2009 |
| JP | 60137173 A | 7/1985 |

OTHER PUBLICATIONS

International Search Report issued Nov. 5, 2009 in connection with International Patent Application No. PCT/CN2009/072932.

Written Opinion of the International Searching Authority dated Nov. 5, 2009 in connection with International Patent Application No. PCT/CN2009/072932.

* cited by examiner

*Primary Examiner* — Ryan Jager

(57) ABSTRACT

The present disclosure discloses a digital phase locking loop and a method. The digital phase locking loop includes a trigger and a delay line. The trigger receives a delayed clock signal output by the delay line, and receives a signal of a selection end of a first delay element in the delay line; the selection end is in a gating state before triggering of the trigger. The trigger samples the signal of the selection end of the first delay element, and outputs the sampled signal to a selection end of a second delay element in the delay line; the selection end of the second delay element is in the gating state after triggering of the trigger. The signal of the selection end of the first delay element is sampled by the trigger, and the sampled result is used as the signal of the selection end of the second delay element, thus reducing glitches caused by transition.

13 Claims, 14 Drawing Sheets

DIGITAL PHASE LOCKING LOOP AND METHOD FOR ELIMINATING GLITCHES

CROSS-REFERENCE TO RELATED APPLICATIONS

This application is a continuation of International Application No. PCT/CN2009/072932, filed on Jul. 27, 2009, which claims priority to Chinese Patent Application No. 200810211585.6, filed on Sep. 19, 2008, both of which are hereby incorporated by reference in their entireties.

TECHNICAL FIELD

The present disclosure relates to the field of electronic technologies, and more particularly, to a digital phase locking loop and a method for eliminating glitches.

BACKGROUND

Presently in many chips, information interactions between signals often require a certain phase-delay relationship maintained between two signals. Taking a clock signal and a data signal for example, if a clock is required to sample data stably, a rising edge of the clock must be at least one setup time (the setup time of a register) later than the data. Due to the influence of Process, Voltage and Temperature (PVT), the requirement for a delay between signals may change, and a delay of a circuit for satisfying the delay requirement may also change. For example, in a NAND gate, which is the most elementary unit to form a digital circuit, the drive of a NAND gate rises as the temperature lowers or the voltage rises, and thus its delay may also be shortened. If the influence of the PVT is not compensated, the delay relationship between the signals cannot be guaranteed. One effective way to solve these problems is a Digital Phase Locking Loop (DPLL). The DPLL is used in all kinds of circuit systems to realize the delay capable of dynamically compensating the influence of the PVT, especially in high-speed circuits, such as a Double Data Rate dynamic random access memory (DDR) and a clock generation module.

The existing DPLL is usually used for the delay of the Data Strobe (DQS) in the DDR, and usually its delay function is implemented by a delay element. The structure of a delay element has many forms, one of which includes a buffer (BUF) and a multiplexer (MUX). Referring to FIG. 1, three delay elements, namely, n−1, n and n+1, are provided, and selection signals of the three delay elements are $S_{n-1}$, $S_n$ and $S_{n+1}$ respectively. A one-hot mechanism is used for the selection signals of the delay elements. That is, a selection end S of only one MUX is set to '1' at the same time, and selection ends of other MUXs are all set to '0'. When the DPLL performs delaying, the DPLL determines the number of the delay elements to be used by setting the selection ends of the corresponding delay elements to '1'. For example, at a certain time the selection end 5, of the delay element n is set to '1', so that the number of the delay units selected to perform delaying is n. A delayed clock signal clk_out is obtained after a clock input signal clk_in passes n delay elements, where the clock input signal clk_in passes n BUFs. Due to the influence of the PVT, when the number of the delay elements needs to be adjusted, the selection end of the corresponding delay element of ter adjustment is set to '1'. For example, when the number of the delay elements changes to n+1, the selection end $S_{n+1}$ of the delay element n+1 is set to '1'. The objective of changing the delay time can be achieved by changing the number of the delay elements. If one delay element can produce a delay of 100 ps, twenty delay elements can produce a delay of 2 ns. Another delay structure, as shown in FIG. 2, includes BUFs and one MUX. One MUX is connected to multiple BUFs. A selection signal of the MUX is msel. The smallest value of msel is 0. When msel is 0, the clock input signal clk_in is directly output as the clk_out without passing any BUF. When msel is 1, the clock input signal clk_in is output as the clk_out after passing one BUF. Analogically, when the msel is n, the clock input signal clk_in is output as the clk_out after passing n BUFs. The value of msel represents the number of the BUFs to be passed. By changing the value of msel, the number of the BUFs that the clock input signal clk_in passes is changed accordingly, so that the objective of changing the delay time can be achieved. If one BUF produces a delay of 5 ns, passing 20 BUFs can delay the clk_in 100 ns.

Besides, another kind of delay element formed by gate circuits is provided. Because the delay of a NOR gate, an AND gate or an OR gate is longer than that of a NOT gate and a NAND gate, usually NAND gate circuits are used to form the delay element. For example, referring to FIG. 3, m delay elements, $S_0, \ldots S_n, S_{n+1}, \ldots$ and $S_m$ (m>n) are provided, and selection signals of the delay elements are $MSEL_0, \ldots MSEL_n, MSEL_{n+1}, \ldots,$ and $MSEL_m$ respectively. The delay elements use the one-hot mechanism. When the selection signal $MSEL_n$ of the delay element $S_n$ is set to '1', the delayed clock signal clk_out is obtained after the clock input signal clk_in passes n delay elements (3n NAND gates). If the number of delay elements needs to be delayed is adjusted to be n+1, the selection signal $MSEL_{n+1}$ of the delay element $S_{n+1}$ is set to '1'. Different number of delay elements leads to different delay time. If one NAND gate can produce a delay of 5 ns, one delay element can produce a delay of 15 ns, and 10 delay elements can produce a delay of 150 ns and so on.

During the implementation of the present disclosure, the inventors find that the prior art has at least the following disadvantages.

When a DPLL dynamically compensates the influence of the PVT, glitches occur, so that the operation of sensitive circuits at the edge turns abnormal or even a whole system turns abnormal. For example, when a DPLL uses delay elements formed by BUFs and MUXs, during the update of the number of the delay elements, glitches are very likely to occur because of the transition of the selection ends of the MUXs. Referring to FIG. 4, the clk_in represents a clock input signal. A clock cycle is 50 ns. As shown in FIGS. 4, E, B, F, and I represent the signals at points E, B, F, and I in FIG. 1 respectively, and S represents the selection signal of a MUX. When the clock input signal runs to 50 ns, the DPLL changes the number of delay elements from n to n+1. At this moment, the selection end $S_n$ transits from '1' to '0', and the selection end $S_{n+1}$ transits from '0' to '1'. Before the transition, the signal at point I is the same as the signal at point E, and after the transition, the signal at point I is the same as the signal at point F. Because the transition happens at a rising edge of the clock input signal, point E is at a low level, and e point F is at a high level. Point I hopes to follow the low level of point E, but is increased by the signal at point F to the high level however, and then follows the signal at point F, changing to the low level. Thus, a glitch shown in FIG. 4 occurs. When the DPLL uses delay elements with a NAND gate structure, because of the delay of the NAND gates, a glitch also occurs when the number of the delay elements is updated. Referring to FIG. 5, the dashed line in FIG. 5 represents the output after the clk_in is delayed by n delay elements, and the dash-dot line represents the output after the clock input signal clk_in is delayed by n+1 delay elements. At the time of $T_0$ when transition happens at MSEL, because the delay time represented by the thin solid line is different from the delay time represented by the heavy solid line, a glitch occurs at point c in the delay element $S_n$.

SUMMARY

Embodiments of the present disclosure provide a digital phase locking loop and a method for eliminating glitches, so as to prevent glitches from occurring during a delay process. The technical solutions are as follows.

An embodiment of the present disclosure provides a digital phase locking loop. The digital phase locking loop includes a trigger and a delay line. The delay line includes a first delay element and a second delay element.

The trigger is configured to sample a signal of a selection end of the first delay element by using a delayed clock signal, and output the sampled signal to a selection end of the second delay element. The selection end of the first delay element is in a gating state before triggering of the trigger. The selection end of the second delay element is in the gating state after the triggering of the trigger. A trigger end of the trigger is connected to an output end of the delay line. An input end of the trigger is connected to the selection end of the first delay element. An output end of the trigger is connected to the selection end of the second delay element.

The delay line is configured to: receive a clock input signal, and output the delayed clock signal according to an order of the delay; before triggering of the trigger, delay the clock input signal according to the order of the delay corresponding to the first delay element, to obtain the delayed clock signal; and, after triggering of the trigger, delay the clock input signal according to the order of the delay corresponding to the second delay element, to obtain the delayed clock signal.

An embodiment of the present disclosure also provides a method for eliminating glitches, where the method is applied in a digital phase locking loop including a delay line and a trigger. The method includes the following steps.

The trigger receives a delayed clock signal output by the delay line at a trigger end, and receives a signal of a selection end of a first delay element in the delay line at an input end, where the selection end of the first delay element is in a gating state before triggering of the trigger.

The trigger samples the signal of the selection end of the first delay element by using the delayed clock signal, and outputs the sampled signal to a selection end of a second delay element in the delay line, where the selection end of the second delay element is in the gating state after the triggering of the trigger.

According to embodiments of the present disclosure, a trigger is added into a digital phase locking loop, a selection signal of a first delay element is sampled in a delay line by using a delayed clock signal, and the sampled result is used as a selection signal of a second delay element in the delay line. In this way, selection end transition of the delay elements in the delay line is kept away from the edge of the clock input signal, thereby effectively avoiding glitches caused by the transition that occurs when the order of the delay is updated at the edge of the clock.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION

The technical solution of the present disclosure will be clearly described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

Figure 6:
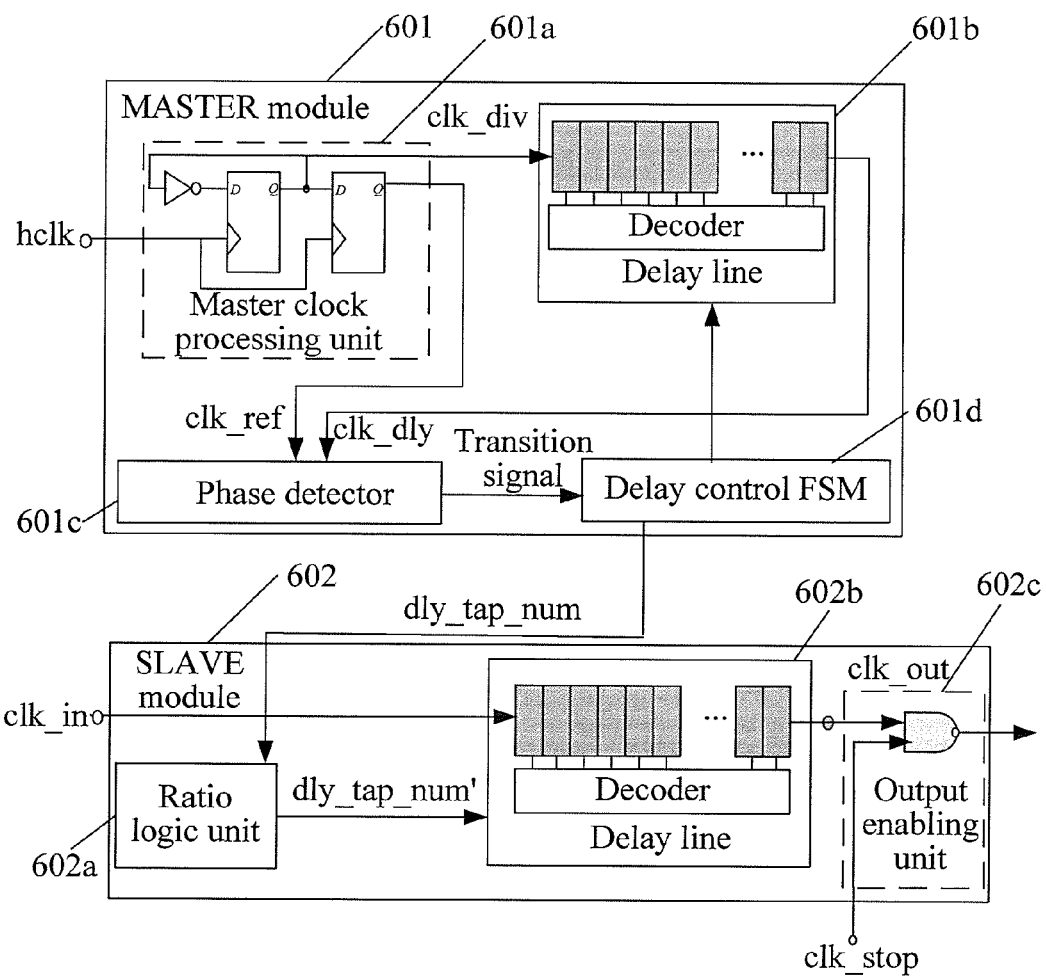
FIG. 6 is a schematic view of the structure of a digital phase locking loop according to an embodiment of the present disclosure.

According to an embodiment of the present disclosure, glitches during the update of the order of delay are eliminated by adding a trigger into a digital phase locking loop. The digital phase locking loop provided in the embodiment of the present disclosure includes a MASTER module and SLAVE modules. The MASTER module may be connected to multiple SLAVE modules. Referring to FIG. 6, the application that a MASTER module 601 is connected to a SLAVE module 602 is taken as an example for illustration.

The MASTER module 601 is configured to test a clock cycle of a system, map the tested clock cycle to an order of delay, and output the order of delay to the SLAVE module 602 as a reference for delay. The MASTER module 601 is also configured to test the clock cycle of the system periodically, delay the system clock if influence of PVT needs to be compensated, and output, after the delay, an indication indicating that the MASTER is locking and a refresh pulse to the SLAVE module 602. The MASTER module 601 includes a master clock processing unit 601a, a delay line 601b, a phase detector 601c and a delay control finite state machine (FSM) 601d.

The master clock processing unit 601a is configured to perform divide-by-2 processing on a master clock hclk of the system, that is, divide the frequency into to a half of the frequency of the master clock and change a cycle into twice of the cycle of the master clock. After the divide-by-2 processing, one channel of output undergoes a logical NOT operation first, and then is sent to the delay line 601b as a clock division signal clk_div, and the other channel of output is sent to the phase detector 601c as a reference signal clk_ref.

The delay line 601b is configured to receive a clock division signal sent by the master clock processing unit 601a, delay the clock division signal according to the order of the delay indicated by the delay control FSM 601d, and send the delayed clock signal clk_dly to the phase detector 601c.

The phase detector 601c is configured to receive the reference signal clk_ref sent by the master clock processing unit 601a, sample the received delayed clock signal clk_dly sent by the delay line 601b, and send the sampled result to the delay control FSM 601d as a transition signal. Specifically, a rising edge of the reference signal is used to sample the delayed clock signal, until a falling edge of the delayed clock signal arrives. At this moment, the difference between the reference signal and the delayed clock signal is half of one cycle, which means the master clock hclk is delayed by the delay line 601b for one cycle. Furthermore, the falling edge of the reference signal may also be used to sample the delayed clock signal.

The delay control FSM 601d is configured to receive the transition signal sent by the phase detector 601c and judge whether the transition signal changes. If the transition signal does not change, the delay control FSM 601d sends a command for increasing the order of the delay by one unit to the delay line 601b, to instruct the delay line 601b to delay the clock division signal according to the increased order of the delay. If the transition signal changes, the delay line 601b completes the delay, and the delay control FSM 601d outputs an indication indicating that the MASTER is locking, an update pulse and a current order of the delay dly_tap_num of the delay line 601b to the SLAVE module 602. The delay control FSM 601d is also configured to test the clock cycle of the system periodically, and instruct the delay line 601b to adjust the order of the delay if the influence of the PVT needs to be compensated.

The SLAVE module 602 is configured to delay the clock input signal clk_in according to the order of the delay dly_tap_num sent by the MASTER module 601. The SLAVE module 602 includes a ratio logic unit 602a, a delay line 602b and an output enabling unit 602c.

The ratio logic unit 602a is configured to receive the update pulse and the order of the delay dly_tap_num that are sent by the delay control FSM 601d, calculate the order of the delay according to a preset ratio, and send the calculated order of the delay dly_tap_num' to the delay line 602b. The preset ratio can be written into the ratio logic unit 602a through a register, and dly_tap_num'=dly_tap_num*the present ratio.

The delay line 602b is configured to receive the order of the delay dly_tap_num' sent by the ratio logic unit 602a, delay the clock input signal according to the received order of the delay, and send the delayed clock signal clk_out to the output enabling unit 602c.

The output enabling unit 602c is configured to exercise output enabling control over the delayed clock signal clk_out output by the delay line 602b. When the delayed clock signal is allowed to be output, an output enabling end clk_stop is set to '1'; when the delayed clock signal is not allowed to be output, the output enabling end is set to '0'. The value of the output enabling end can be set by a register.

Figure 1:
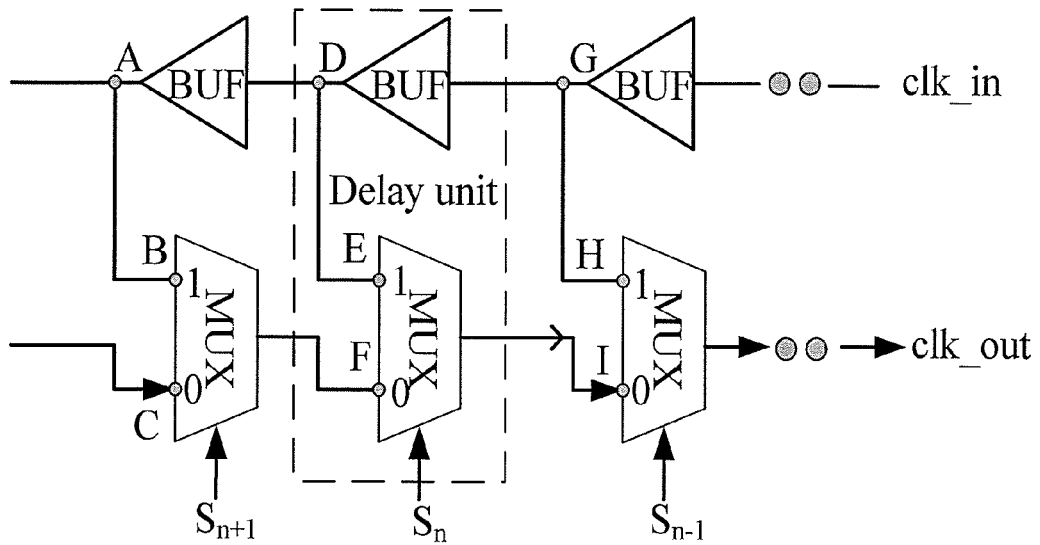
FIG. 1 is a schematic view of a structure of delay elements formed by BUFs and MUXs in the prior art.
Figure 2:
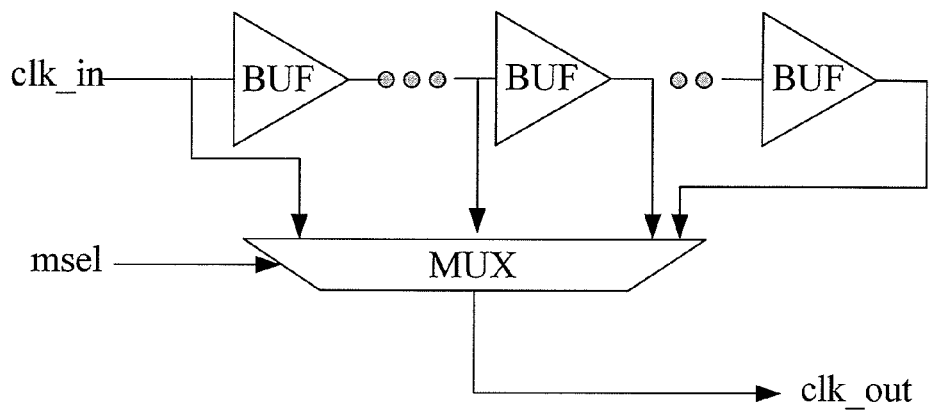
FIG. 2 is a schematic view of another structure of delay elements formed by BUFs and a MUX in the prior art.
Figure 3:
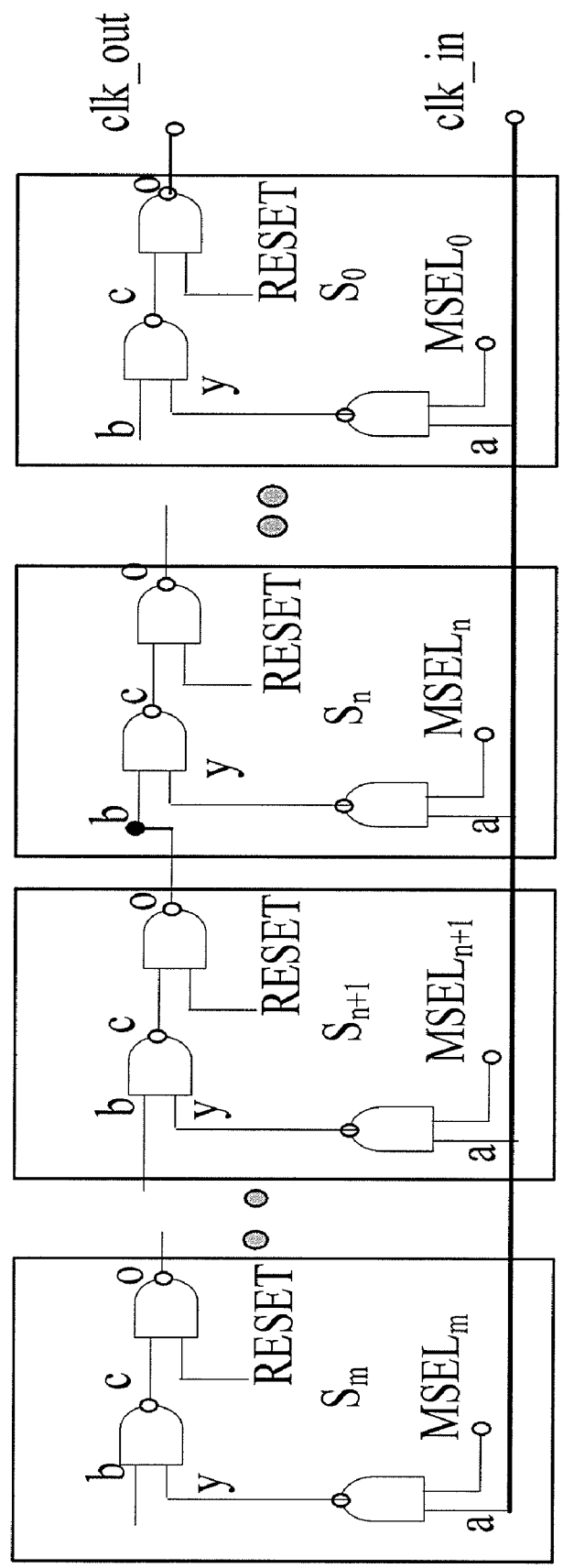
FIG. 3 is a schematic view of the structure of delay elements formed by NAND gates in the prior art.
Figure 4:
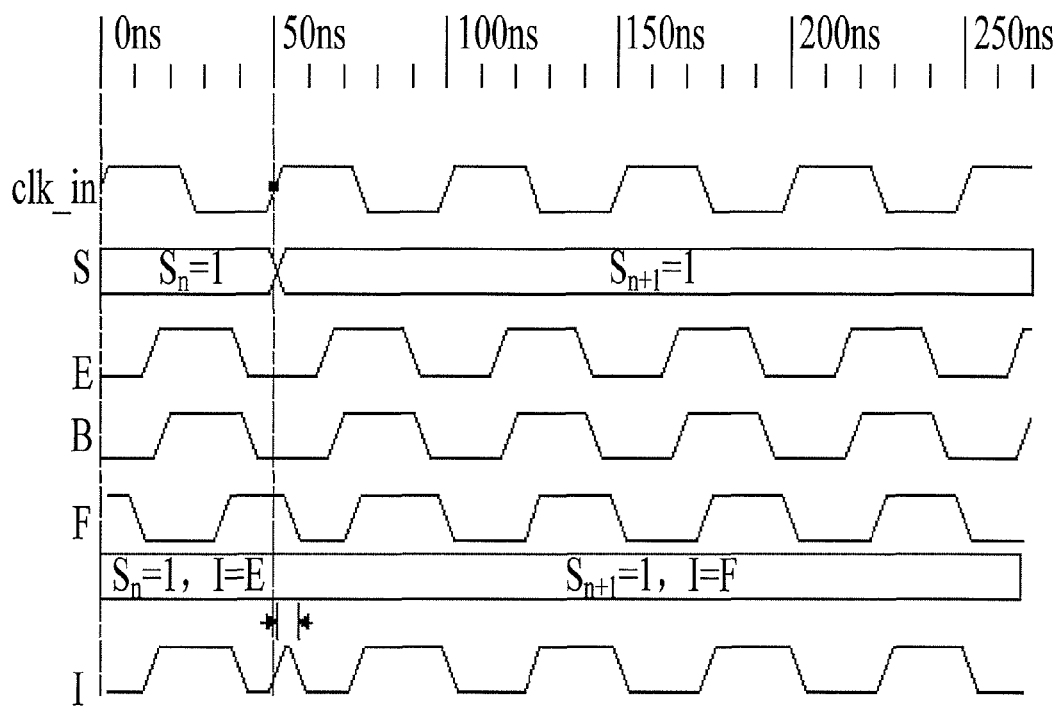
FIG. 4 is a timing diagram of the update of the order of delay of the delay element in FIG. 1.
Figure 5:
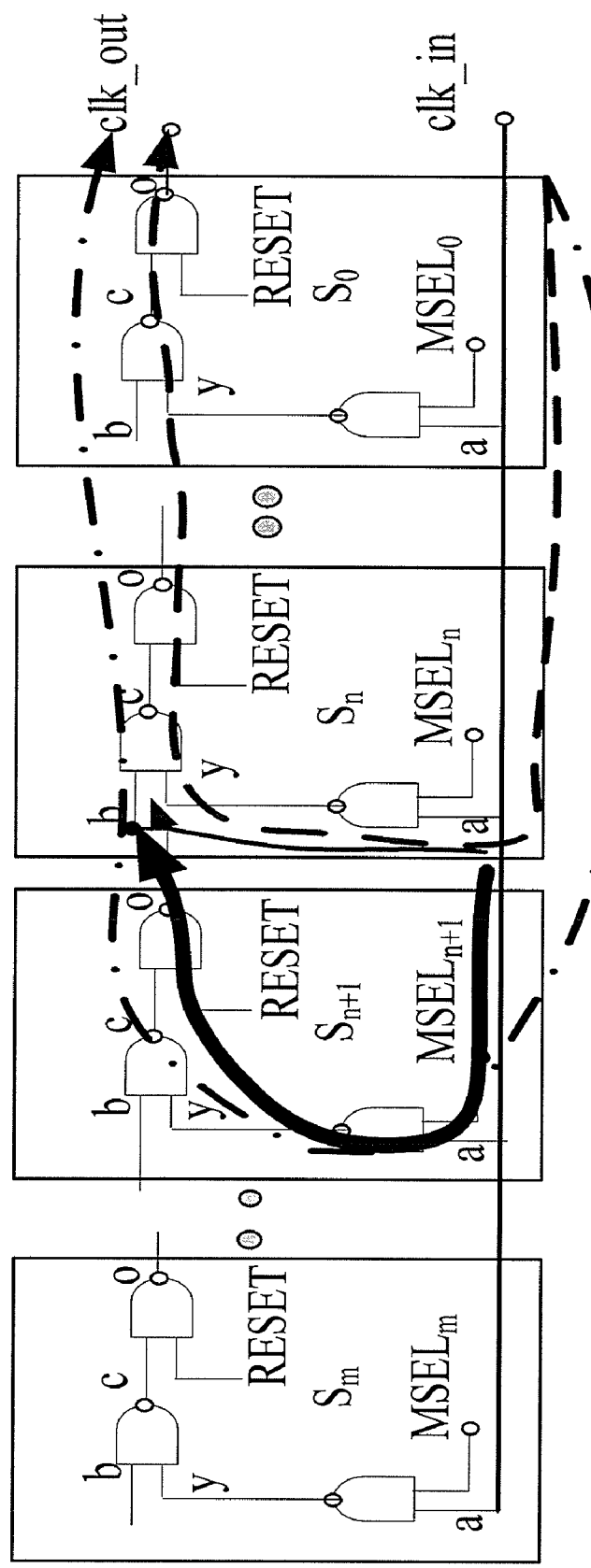
FIG. 5 is a schematic view of the clock path of the delay element in FIG. 3.

In the embodiments of the present disclosure, delay elements in the delay lines (including the 601b and the 602b) may be formed by OR gates, NOR gates, AND gates or NAND gates; besides, the delay elements may also be formed by MUXs and BUFs. For details about the internal structure of delay elements, reference can be made to existing structures, such as the delay element structure shown in FIG. 3, and thus the internal structure of delay elements is not repeatedly described here.

Figure 7:
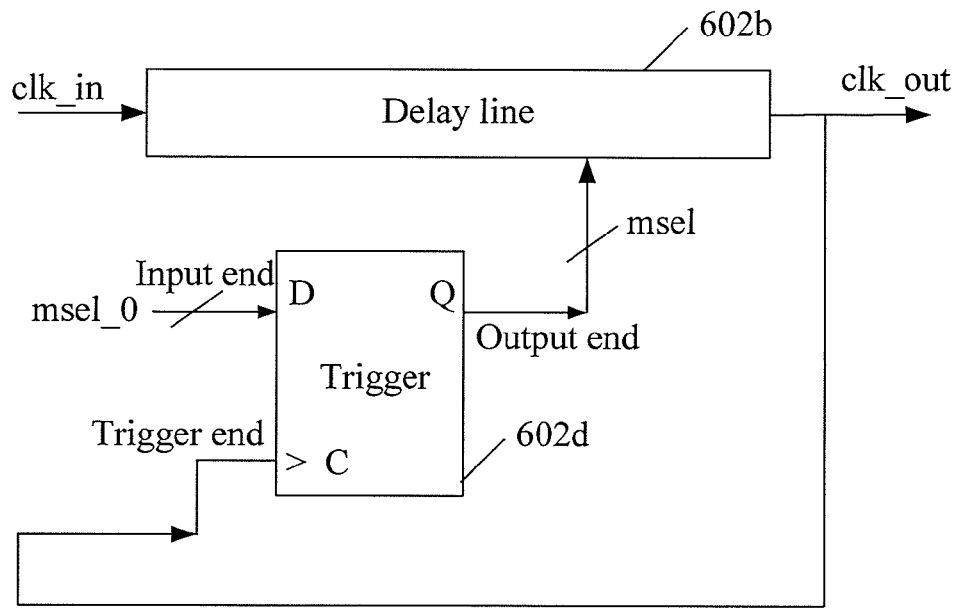
FIG. 7 is a schematic view of a first structure of a delay line and a trigger according to an embodiment of the present disclosure.

An embodiment of the present disclosure provides a digital phase locking loop. The digital phase locking loop, including a MASTER module 601 and a SLAVE module 602, is similar to the digital phase locking loop shown in FIG. 6. The MASTER module 601 includes a master clock processing unit 601a, a delay line 601b, a phase detector 601c and a delay control FSM 601d. The SLAVE module 602 includes a ratio logic unit 602a, a delay line 602b and an output enabling unit 602c. The difference between the digital phase locking loop according to this embodiment and that shown in FIG. 6 lies in that, the SLAVE module 602 provided in this embodiment further includes a trigger 602d, which is connected to the delay line 602b. Referring to FIG. 7, the details are as follows.

The trigger 602d is configured to sample a signal of a selection end msel_0 of a first delay element in the delay line 602b by using the delayed clock signal clk_out, and output the sampled signal to a selection end of a second delay element in a delay line. Before triggering of the trigger, the selection end msel_0 of the first delay element is set to '1', that is, in the gating state; after triggering of the trigger, the selection end msel of the second delay element is set to '1', that is, in the gating state. A trigger end C of the trigger 602d is connected to an output end of the delay line 602b. An input end D of the trigger 602d is connected to the selection end msel_0 of the first delay element. An output end Q of the trigger 602d is connected to the selection end msel of the second delay element. The trigger end C is high level effective, that is, the trigger end C is effective at the rising edge of the delayed clock signal clk_out. It should be understood that, in order to keep the selection end msel_0 of the first delay element be in the gating state before triggering of the trigger, the selection end msel_0 of the first delay element may also be set to '0' or another value; in order to keep the selection end msel of the second delay element be in the gating state before triggering of the trigger, the selection end msel of the second delay element may also be set to '0' or another value.

Accordingly, the delay line 602b is also configured to: before triggering of the trigger 602d, delay the clock input signal clk_in according to the order of the delay corresponding to the first delay element, to obtain the delayed clock signal clk_out; and, after triggering of the trigger 602d, delay the clock input signal clk_in according to the order of the delay corresponding to the second delay element, to obtain the delayed clock signal clk_out.

Figure 8:
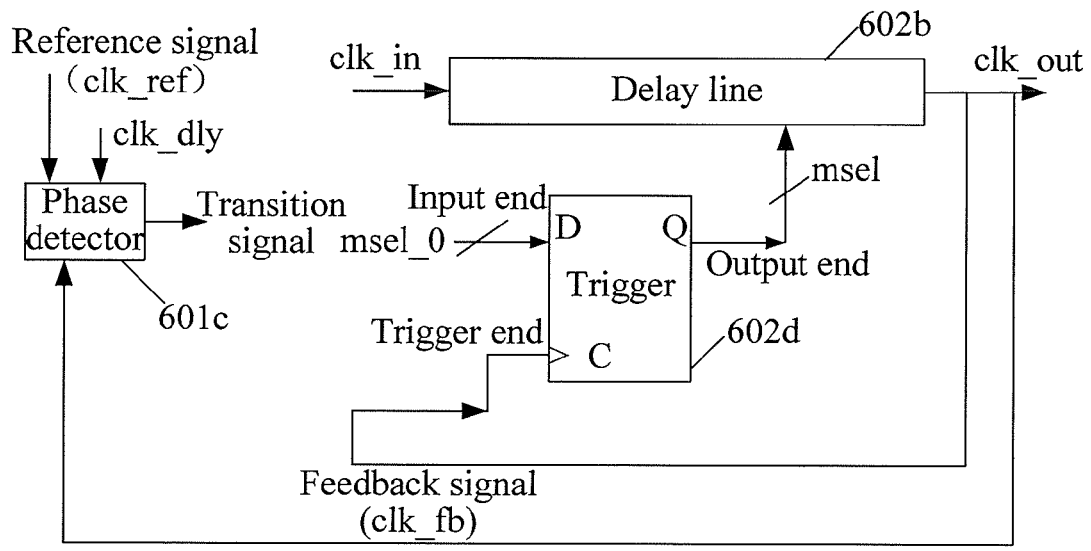
FIG. 8 is a schematic view of a first structure of a delay line, a trigger and a phase detector according to an embodiment of the present disclosure.

Furthermore, in order to improve the precision of controlling the delay line, fine-tuning may also be performed on the delay line 602b, after the phase detector 601c uses the reference signal clk_ref sent by the master clock processing unit 601a to sample the delayed clock signal clk_dly sent by the delay line 601b and to output a transition signal, and after coarse-tuning is performed on the delay line 602b by the delay control FSM 601d and the ratio logic unit 602a by using the transition signal. Referring to FIG. 8 and FIG. 6, the phase detector 601c in this embodiment is also configured to sample, by using the received reference signal clk_ref, the delayed clock signal clk_out, that is, a feedback signal clk_fb, output by the delay line 602b, obtain a phase difference between the reference signal and the feedback signal, and output a transition signal according to the phase difference. The phase detector 601c outputs the transition signal if the phase difference is 0, or does not output the transition signal if the phase difference is not 0. The phase detector 601c controls, through the transition signal, whether the delay line 602b continues to update the order of the delay based on the order of the delay corresponding to the second delay element.

Figure 9:
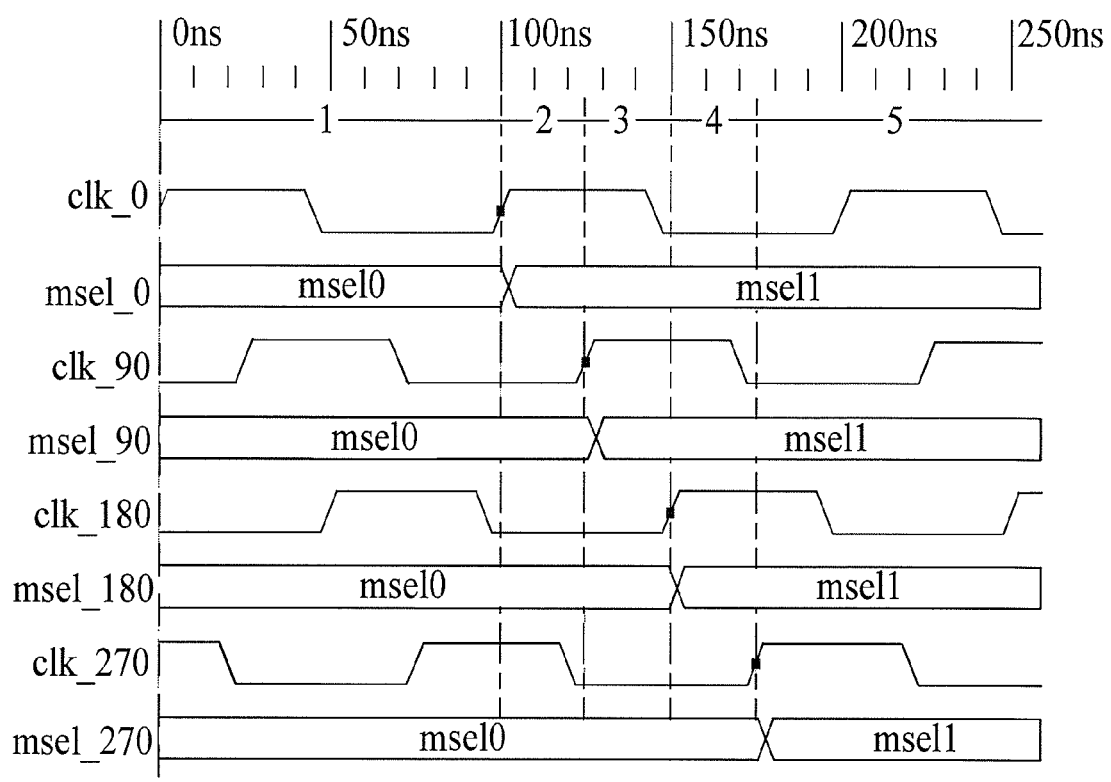
FIG. 9 is a timing diagram of the update of a delay line according to an embodiment of the present disclosure.

FIG. 9 is a timing diagram of the trigger 602d in this embodiment. In the figure, clk_0 represents that the clock input signal clk_in is delayed by the delay line 602b for 0°, and msel_0 represents the transition status of the selection end of a delay element in the delay line 602b when the clk_0 is used as a trigger signal. Here, msel0 represents that the selection end of the first delay element transits from '1' to '0', msel1 represents that the selection end of the second delay element transits from '1' to '0', clk_90 represents the clock input signal clk_in is delayed by the delay line 602b for 90°, and msel_90 represents the transition status of the selection end of a delay element in the delay line 602b when clk_90 is used as a trigger signal. As shown in FIG. 9, the clock input signal clk_in is delayed by four different phases. All the changes of the selection ends of the delay elements in the delay line 602b, after triggering of the trigger 602d, occur after the rising edge of the delayed clock signal clk_out.

In this embodiment, the trigger is added in the digital phase locking loop. By using the delayed clock signal clk_out as the signal at the trigger end of the trigger, the selection signal of the first delay element in the delay line 602b, that is, the signal at the input end msel_0 of the trigger is sampled. The sampled result, that is, the signal at the output end msel of the trigger, is used as the selection signal of the second delay element in the delay line, so that the changes of the selection ends of the delay elements in the delay line 602b occur after the rising edge of the delayed clock signal clk_out, thereby effectively avoiding glitches caused by the transition that occurs when the order of the delay is updated at the edge of the clock.

Figure 10:
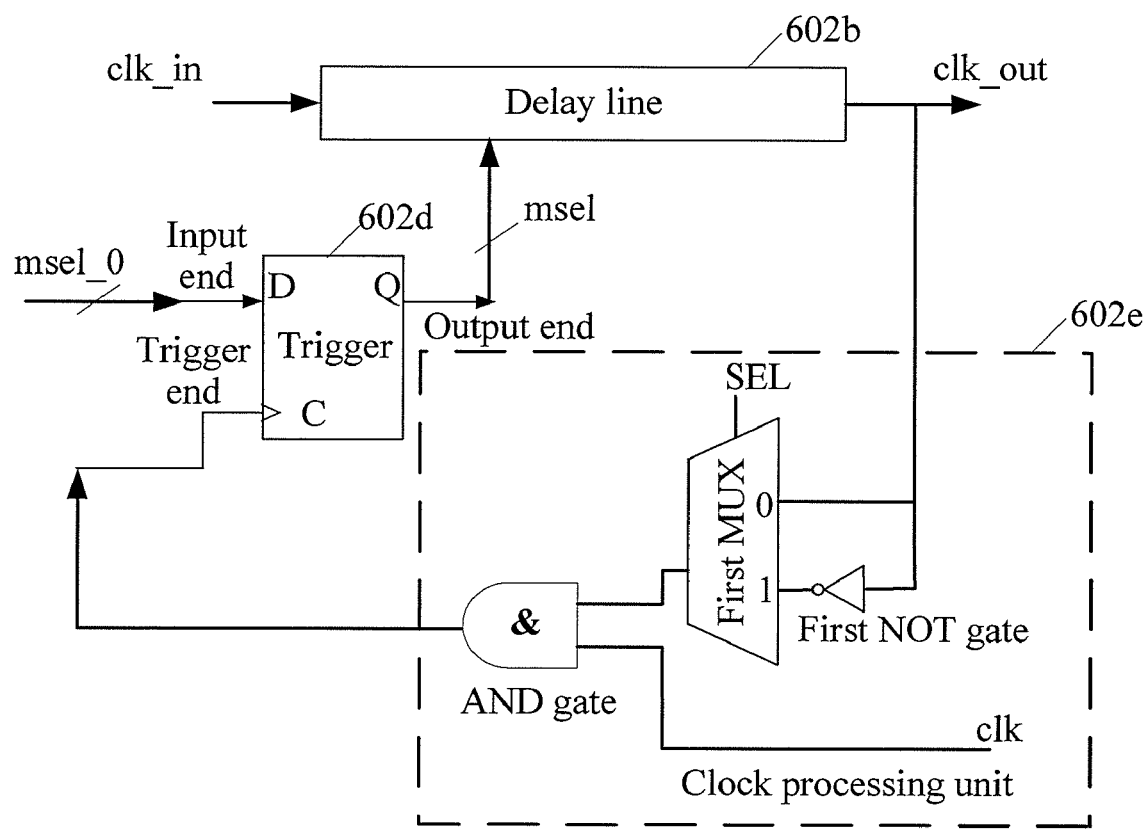
FIG. 10 is a schematic view of a second structure of a delay line and a trigger according to an embodiment of the present disclosure.

An embodiment of the present disclosure also provides a digital phase locking loop, including a MASTER module 601 and a SLAVE module 602. The digital phase locking loop in this embodiment is the same as the digital phase locking loop shown in FIG. 6 in that the MASTER module 601 includes a master clock processing unit 601a, a delay line 601b, a phase detector 601c and a delay control FSM 601d, and the SLAVE module 602 includes a ratio logic unit 602a, a delay line 602b and an output enabling unit 602c. The difference between the digital phase locking loop according to this embodiment and that shown in FIG. 6 lies in that, the SLAVE module 602 provided in this embodiment further includes a trigger 602d and a clock processing unit 602e, and in this embodiment, delay elements in the delay line 602b are formed by OR gates or NOR gates. Referring to FIG. 10, the details are as follows.

The trigger 602d is configured to sample a signal of a selection end msel_0 of a first delay element in the delay line 602b by using a delayed clock signal clk_out, and output the sampled signal to a selection end msel of a second delay element in the delay line. Before triggering of the trigger, the selection end msel_0 of the first delay element is set to '1'; after triggering of the trigger, the selection end msel of the second delay element is set to '1'. A trigger end C of the trigger 602d is connected to an output end of the clock processing unit 602e, an input end D of the trigger 602d is connected to the selection end msel_0 of the first delay element, and an output end Q of the trigger 602d is connected to the selection end msel of the second delay element. The trigger end C is high level effective, that is, the trigger end C is effective when the clock input signal clk_in is at the high level and after the edge of the delayed clock signal clk_out.

Accordingly, the delay line 602b is also configured to: before triggering of the trigger 602d, delay the clock input signal clk_in according to the order of the delay corresponding to the first delay element to obtain the delayed clock signal clk_out; and after triggering of the trigger 602d, delay the clock input signal clk_in according to the order of the delay corresponding to the second delay element to obtain the delayed clock signal clk_out.

The clock processing unit 602e is configured to perform logic operation on the system clock signal clk and the clock signal clk_out delayed by the delay line 602b. The clock processing unit 602e specifically includes a first NOT gate, a first MUX and an AND gate.

The first NOT gate is configured to receive the delayed clock signal clk_out output by the delay line 602b, and output a signal to a '1' end of the first MUX.

The first MUX is configured to receive, from a '0' end, the delayed clock signal clk_out output by the delay line 602b, receive, from the '1' end, the signal output by the first NOT gate, and output a signal to the AND gate.

The AND gate is configured to receive the signal output by the first MUX and the system clock signal clk, and output a signal to the trigger end C of the trigger 602d.

The value of the selection end SEL of the first MUX can be controlled by a control unit. When the clock input signal clk_in is delayed for a time longer than or equal to one quarter of one clock cycle and shorter than or equal to three quarters of one clock cycle, the signal of the SEL is set to '0'; when the clock input signal clk_in is delayed for a time longer than or equal to zero clock cycle and shorter than one quarter of one clock cycle, or the clock input signal clk_in is delayed for a time longer than three quarters of one clock cycle and shorter than or equal to one clock cycle, the signal of the SEL is set to '1'.

Figure 11:
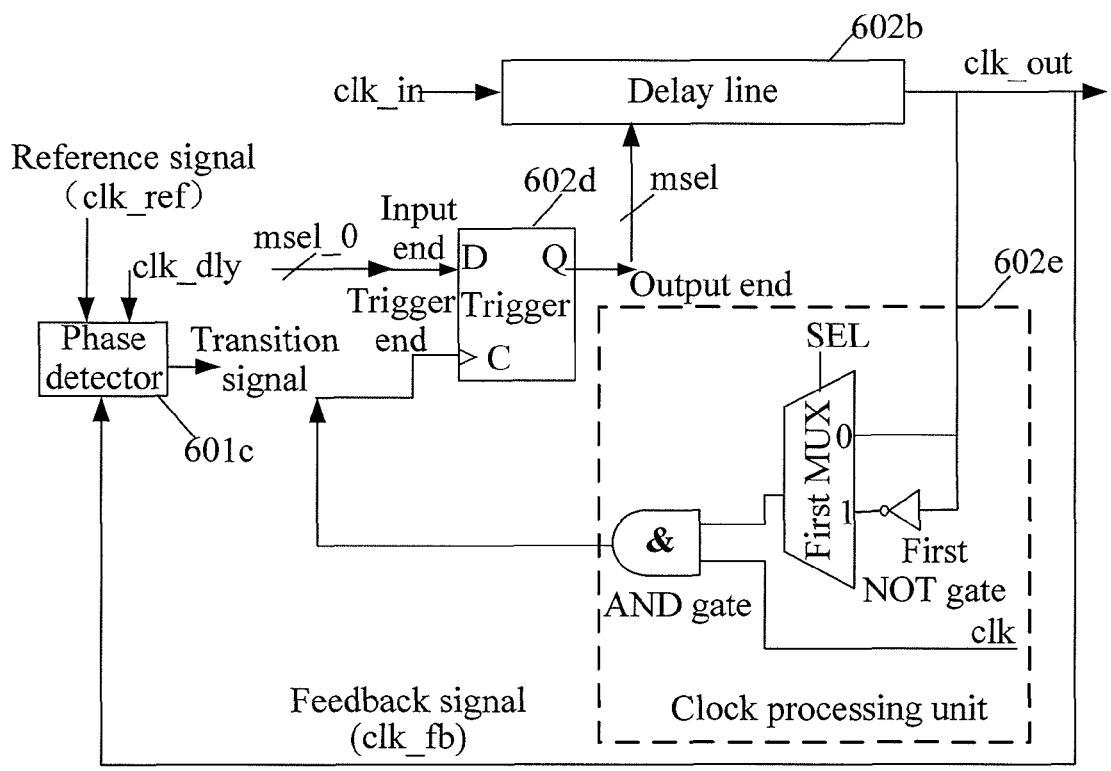
FIG. 11 is a schematic view of a second structure of a delay line, a trigger and a phase detector according to an embodiment of the present disclosure.

Furthermore, in order to improve the precision of controlling the delay line, fine-tuning may also be performed on the delay line 602b after the phase detector 601c uses the reference signal clk_ref sent by the master clock processing unit 601a to sample the delayed clock signal sent by the delay line 601b and output a transition signal, and after coarse-tuning is performed on the delay line 602b by the delay control FSM 601d and the ratio logic unit 602a by using the transition signal. Referring to FIG. 11 and FIG. 6, the phase detector 601c in this embodiment is also configured to sample the delayed clock signal clk_out, that is, a feedback signal clk_fb, output by the delay line 602b by using the received reference signal clk_ref, obtain a phase difference between the reference signal and the feedback signal, and output a transition signal according to the phase difference. The phase detector 601c outputs the transition signal if the phase difference is 0, or does not output the transition signal if the phase difference is not 0. The phase detector 601c controls, through the transition signal, whether the delay line 602b continues to update the order of the delay based on the order of the delay corresponding to the second delay element.

In this embodiment, the trigger and the clock processing unit are added into the digital phase locking loop. By using the result of processing the delayed clock signal clk_out and the system clock signal clk as the signal at the trigger end of the trigger, the selection signal of the first delay element in the delay line 602b, that is, the signal at the input end msel_0 of the trigger, is sampled. The sampled result, that is, the signal at the output end msel of the trigger, is used as the selection signal of the second delay element in the delay line, so that changes of the selection ends of the delay elements in the delay line 602b occur when the system clock signal clk is at a high level and after the edge of the delayed clock signal clk_out, thereby effectively avoiding glitches caused by the transition that occurs when the order of the delay is updated at the edge of the clock and caused by the difference between the delay time of the first delay element and the delay time of the second delay element. Therefore, the glitches are eliminated. Furthermore, the digital phase locking loop in this embodiment may be configured to delay the clock by any phase without causing a glitch, and may be used in the DDR and the delay for the system clock.

Figure 12:
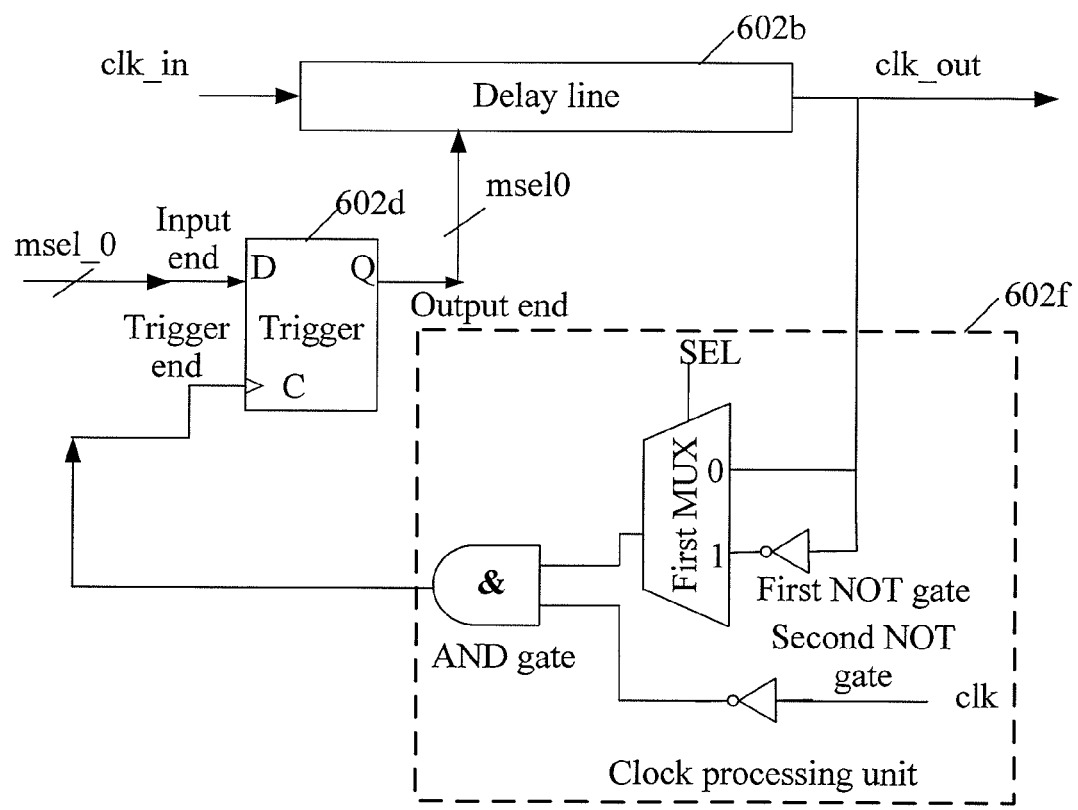
FIG. 12 is a schematic view of the structure of a delay line, a trigger and a clock processing unit according to an embodiment of the present disclosure.

An embodiment of the present disclosure also provides a digital phase locking loop, including a MASTER module 601 and a SLAVE module 602. The difference between the digital phase locking loop according to this embodiment and that shown in FIG. 10 lies in that, the SLAVE module 602 provided in this embodiment includes a clock processing unit 602f. Compared with the clock processing unit 602e in embodiments shown in FIG. 10 and FIG. 11, besides the first NOT gate, the first MUX and the AND gate, the clock processing unit 602f further includes a second NOT gate. Furthermore, in this embodiment, delay elements in the delay line 602b are formed by AND gates or NAND gates, or formed by MUXs and BUFs. Referring to FIG. 12, the details are as follows.

The trigger end C of the trigger 602d is high level effective, that is, the trigger end C of the trigger 602d is effective when the system clock signal clk is at a low level and after the edge of the delayed clock signal clk_out. Other functions of the trigger 602d are as same as those in the embodiments shown in FIGS. 10 and 11. The functions of the delay line 602b are the same as those of the delay line 602b in the embodiments shown in FIGS. 10 and 11, and are not repeatedly described here.

The clock processing unit 602f is configured to perform logic operation on the system clock signal clk and the clock signal clk_out delayed by the delay line 602b. Specifically, the clock processing unit 602f includes a first NOT gate, a first MUX, a second NOT gate and an AND gate.

The first NOT gate is configured to receive the delayed clock signal clk_out output by the delay line 602b, and output a signal to the '1' end of the first MUX.

The first MUX is configured to receive, from the '0' end, the delayed clock signal clk_out output by the delay line 602b, receive, from the '1' end, the signal output by the first NOT gate, and output a signal to the AND gate.

The second NOT gate is configured to receive the system clock signal clk, and output a signal to the AND gate.

The AND gate is configured to receive the signal output by the first MUX and the signal output by the second NOT gate, and output a signal to the trigger end C of the trigger 602d.

The value of the selection end SEL of the first MUX can be controlled by a control unit. In order to guarantee time sequence convergence, the high level width of clk_sample can be guaranteed to be greater than a quarter clock cycle by setting the value of the SEL. When the clock input signal clk_in is delayed for a time longer than or equal to one quarter of one clock cycle and shorter than or equal to three quarters of one clock cycle, the signal of the SEL is set to '0'; when the clock input signal clk_in is delayed for a time longer than or equal to zero clock cycle and shorter than one quarter of one clock cycle, or the clock input signal clk_in is delayed for a time longer than 3 quarters of one clock cycle and shorter than or equal to one clock cycle, the signal of the SEL is set to '1'.

Figure 13:
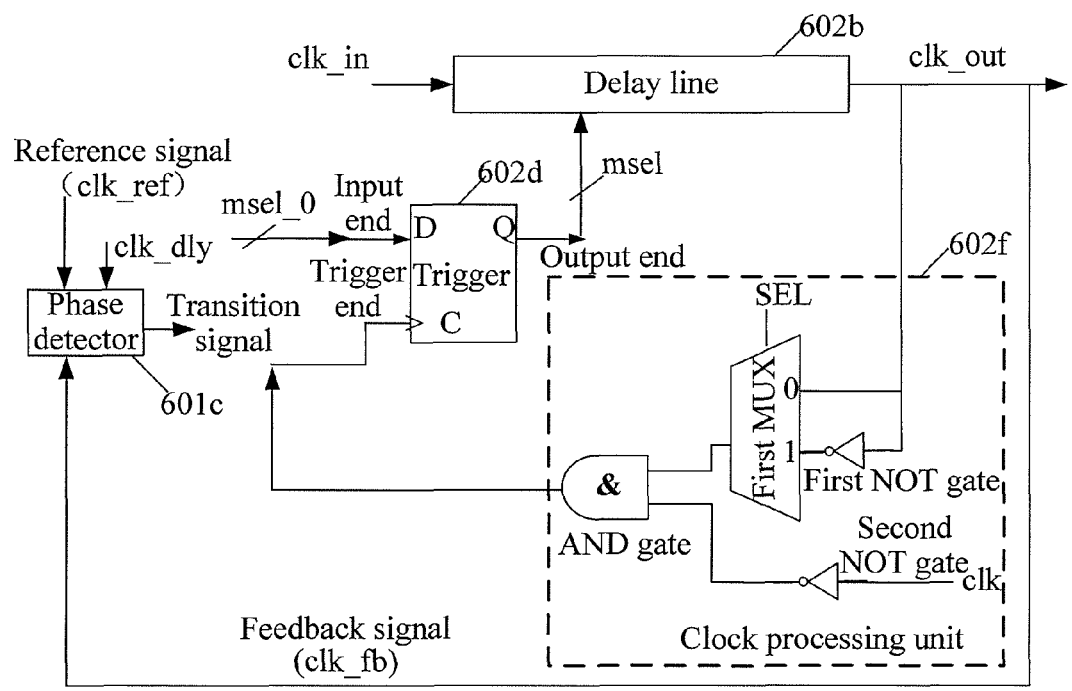
FIG. 13 is a schematic view of the structure of a delay line, a trigger, a clock processing unit and a phase detector according to an embodiment of the present disclosure.

Furthermore, referring to FIG. 13, the phase detector 601c in this embodiment is also configured to sample, by using a received reference signal, the delayed clock signal clk_out, that is, a feedback signal clk_fb, output by the delay line 602b, obtain a phase difference between the reference signal and the feedback signal, and control, by using the phase difference, whether the delay line 602b continues to update the order of the delay based on the order of the delay corresponding to the second delay element.

Figure 14:
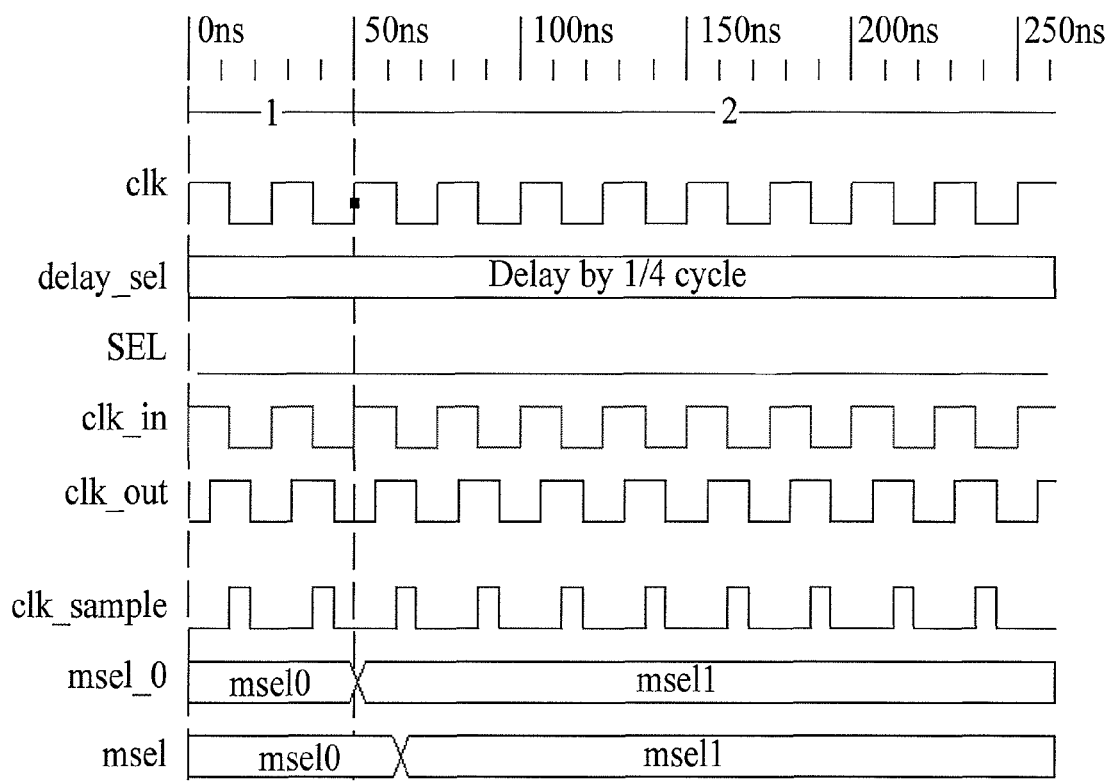
FIG. 14 is a timing diagram of the update of the delay line in the structure shown in FIG. 13.
Figure 15:
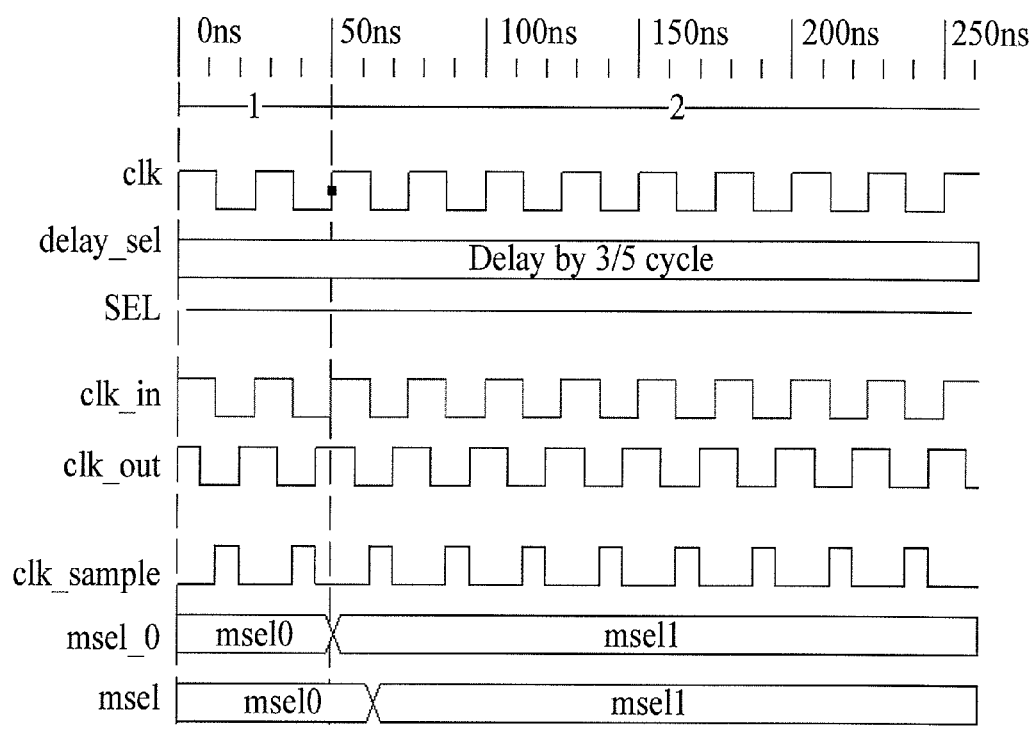
FIG. 15 is another timing diagram of the update of the delay line in the structure shown in FIG. 13.

Referring to FIGS. 14 and 15, clk is a system clock signal, clk_in is a clock input signal and is synchronous with the system clock signal clk, delay_sel represents the size of the phase that the clk_in is to be delayed, SEL represents the signal of the selection end of the MUX, clk_out is a delayed clock signal, clk_sample is an output signal of the AND gate, that is, a trigger signal of the trigger, msel_0 represents the signal of a selection end of a first delay element of the delay line 602b, and msel represents the signal of a selection end of a second delay element of the delay line 602b. As shown in the figures, because it is required to guarantee that the value of the newly sampled msel_sample is at the falling edge of the clock clk and changes after the rising edge of the delayed clock clk_delay, the following two situations may occur: when the rising edge of the delayed clock clk_delay is before the falling edge of the clock clk, the falling edge of the clock clk is used to sample the msel_0; when the rising edge of the delayed clock clk_delay is after the falling edge of the clock clk, the clk_delay is used to sample the msel_0, so as to guarantee that the change of the msel occurs when the clk is at a low level and after the edge of the delayed clock. In order to eliminate glitches more effectively, there should be no big difference between the order of the delay corresponding to the second delay element and the order of the delay corresponding to the first delay element.

In this embodiment, the trigger and the clock processing unit are added into the digital phase locking loop. By using the result of processing the delayed clock signal clk_out and the system clock signal clk, the selection signal of the first delay element in the delay line 602b is sampled. The sampled result is used as the selection signal of the second delay element in the delay line, so that changes of the selection ends of the delay elements in the delay line 602b occur when the system clock signal clk is at the low level and after the edge of the delayed clock signal clk_out, thereby effectively avoiding glitches caused by the transition that occurs when the order of the delay is updated at the edge of the clock and caused by the difference between the delay time of the first delay element and the delay time of the second delay element. Therefore, it is guaranteed that when the digital phase locking loop dynamically compensates the influence of the PVT, the glitches do not occur. Furthermore, the digital phase locking loop in this embodiment may be configured to delay the clock for any phase, without causing a glitch, and may be used in the DDR and the delay for the system clock.

Figure 16:
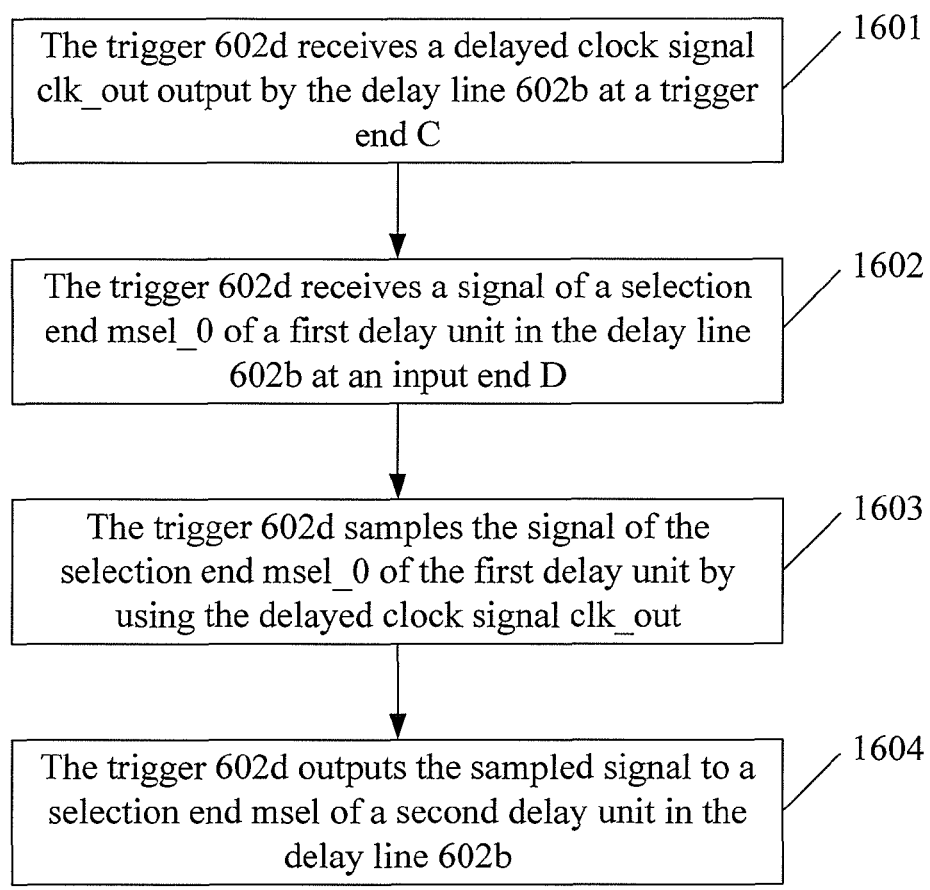
FIG. 16 is a flow chart of a method for eliminating glitches according to an embodiment of the present disclosure.

Referring to FIG. 16, an embodiment of the present disclosure provides a method for eliminating glitches, where the method is applied in a digital phase locking loop including a delay line 602b and a trigger 602d. Specifically, the method includes the following steps.

In step 1601, the trigger 602d receives a delayed clock signal clk_out output by the delay line 602b at a trigger end C.

In step 1602, the trigger 602d receives, from an input end D, a signal of a selection end msel_0 of a first delay element in the delay line 602b; the selection end msel_0 of the first delay element is set to '1' before triggering of the trigger 602d.

In step 1603, the trigger 602d samples the signal of the selection end msel_0 of the first delay element by using the delayed clock signal clk_out.

In step 1604, the trigger 602d outputs the sampled signal to a selection end msel of a second delay element in the delay line 602b; the selection end msel of the second delay element is set to '1' after triggering of the trigger 602d.

Furthermore, the method may also include the following steps.

A phase detector 601c in the digital phase locking loop samples, by using a received reference signal clk_ref, the delayed clock signal output by the delay line 602b triggered by the trigger 602d, obtains a phase difference between the reference signal clk_ref and the delayed clock signal clk_out, and control, by using the phase difference, whether the delay line 602b continues to update the order of the delay based on the order of the delay corresponding to the second delay element.

Furthermore, in this embodiment, when the delay elements in the delay line 602b are formed by OR gates or NOR gates, and the digital phase locking loop also includes a clock processing unit 602e formed by a first NOT gate, a first MUX and an AND gate, step 1601 specifically includes the following.

The first NOT gate receives the delayed clock signal clk_out output by the delay line 602b, and outputs a signal to the '1' end of the first MUX. The first MUX receives, from the '0' end, the delayed clock signal clk_out output by the delay line 602b, receives, from the '1' end, the signal output by the first NOT gate, and outputs a signal to the AND gate. The AND gate receives the signal output by the first MUX and the system clock signal clk, and outputs a signal to the trigger end C of the trigger 602d. The trigger 602d receives, from the trigger end C, the signal output by the AND gate.

Furthermore, in this embodiment, when the delay elements in the delay line 602b are formed by AND gates or NAND gates, or formed by MUXs and BUFs, and the digital phase locking loop also includes a clock processing unit 602f formed by a first NOT gate, a first MUX, a second NOT gate and an AND gate, step 1601 specifically includes the following.

The first NOT gate receives the delayed clock signal clk_out output by the delay line 602b, and outputs a signal to the '1' end of the first MUX. The first MUX receives, from the '0' end, the delayed clock signal clk_out output by the delay line 602b, receives, from the '1' end, the signal output by the first NOT gate, and outputs a signal to the AND gate. The second NOT gate receives the system clock signal clk, and outputs a signal to the AND gate. The AND gate receives the signal output by the first MUX and the signal output by the second NOT gate, and outputs a signal to the trigger end C of the trigger 602d. The trigger 602d receives, from the trigger end C, the signal output by the AND gate.

In this embodiment, when the clock input signal clk_in is delayed for a time longer than or equal to one quarter of one clock cycle and shorter than or equal to three quarters of one clock cycle, the signal of the selection end of the first MUX is set to '0'; when the clock input signal clk_in is delayed for a time longer than or equal to zero clock cycle and shorter than one quarter of one clock cycle, or the clock input signal clk_in is delayed for a time longer than three quarters of one clock cycle and shorter than or equal to one clock cycle, the signal of the selection end of the first MUX is set to '1'. The signal of the selection end of the first MUX can be set by a register.

In this embodiment, the trigger samples the selection signal of the first delay element in the delay line 602b, by using the delayed clock signal clk_out and the system clock signal clk, and the sampled result is used as the selection signal of the second delay element in the delay line, so that changes of the selection ends of the delay elements in the delay line 602b occur after the rising edge of the system clock signal clk, thereby effectively avoiding glitches caused by the transition that occurs when the order of the delay is updated at the edge of the clock and caused by the difference between the delay time of the first delay element and the delay time of the second delay element. Therefore, it is guaranteed that when the digital phase locking loop dynamically compensates the influence of the PVT, the glitches do not occur. Furthermore, the digital phase locking loop in this embodiment may be configured to delay the clock for any phase, without causing a glitch, and may be used in the DDR and the delay for system clock.

All or a part of the technical solutions according to the embodiments of the present disclosure may be implemented by a program instructing relevant hardware. The program may be stored in a computer readable storage medium. The storage medium may be any medium that is capable of storing program codes, such as a ROM, a RAM, a magnetic disk, and an optical disk.

The above descriptions are merely some exemplary embodiments of the present disclosure, but are not intended to limit the present disclosure. Any modification, equivalent replacement, or improvement made without departing from the spirit and principle of the present disclosure should fall within the scope of the present disclosure.

What is claimed is:

1. A digital phase locking loop, comprising a trigger and a delay line, wherein the delay line comprises a first delay element and a second delay element;

the trigger, configured to sample a signal of a selection end of the first delay element by using a delayed clock signal, and output the sampled signal to a selection end of the second delay element, wherein the selection end of the first delay element is in a gating state before triggering of the trigger, the selection end of the second delay element is in the gating state after triggering of the trigger, a trigger end of the trigger is connected to an output end of the delay line, an input end of the trigger is connected to the selection end of the first delay element, and an output end of the trigger is connected to the selection end of the second delay element; and the delay line, configured to receive a clock input signal, and output the delayed clock signal according to an order of delay; before triggering of the trigger delay, delay the clock input signal according to the order of the delay corresponding to the first delay element, to obtain the delayed clock signal; and, after triggering of the trigger, delay the clock input signal according to the order of the delay corresponding to the second delay element, to obtain the delayed clock signal.

2. The digital phase locking loop according to claim 1, further comprising:

a phase detector, configured to sample, by using a received reference signal, the delayed clock signal output by the delay line, obtain a phase difference between the reference signal and the delayed clock signal, output a transition signal according to the phase difference, and control, through the transition signal, whether the delay line continues to update the order of the delay based on the order of the delay corresponding to the second delay element.

3. The digital phase locking loop according to claim 1, wherein the delay elements of the delay line are formed by OR gates, NOR gates, AND gates, or NAND gates, or formed by multiplexers MUXs and buffers.

4. The digital phase locking loop according to claim 3, wherein when the delay elements of the delay line are formed by the OR gates or the NOR gates, the digital phase locking loop further comprises a clock processing unit, and the clock processing unit comprises a first NOT gate, a first MUX, and an AND gate;
the first NOT gate is configured to receive the delayed clock signal output by the delay line, and output a signal to a '1' end of the first MUX;
the first MUX is configured to receive, from a '0' end, the delayed clock signal output by the delay line, receive, from the '1' end, the signal output by the first NOT gate, and output a signal to the AND gate; and
the AND gate is configured to receive the signal output by the first MUX and a system clock signal, and output a signal to the trigger end of the trigger.

5. The digital phase locking loop according to claim 4, further comprising:
a control unit, configured to set a signal of a selection end of the first MUX to '0' when the clock input signal is delayed for a time longer than or equal to one quarter of one clock cycle and shorter than or equal to three quarters of one clock cycle, and set the signal of the selection end of the first MUX to '1' when the clock input signal is delayed for a time longer than or equal to zero clock cycle and shorter than one quarter of one clock cycle, or when the clock input signal is delayed for a time longer than three quarters of one clock cycle and shorter than or equal to one clock cycle.

6. The digital phase locking loop according to claim 3, wherein when the delay elements of the delay line are formed by the AND gates or the NAND gates, or formed by the MUXs and the buffers, the digital phase locking loop further comprises a clock processing unit, and the clock processing unit comprises a first NOT gate, a first MUX, a second NOT gate and an AND gate;
the first NOT gate is configured to receive the delayed clock signal output by the delay line, and output a signal to a '1' end of the first MUX;
the first MUX is configured to receive, from a '0' end, the delayed clock signal output by the delay line, receive, from the '1' end, the signal output by the first NOT gate, and output a signal to the AND gate;
the second NOT gate is configured to receive a system clock signal, and output a signal to the AND gate; and
the AND gate is configured to receive the signal output by the first MUX and the signal output by the second NOT gate, and output a signal to the trigger end of the trigger.

7. The digital phase locking loop according to claim 6, further comprising:
a control unit, configured to set a signal of a selection end of the first MUX to '0' when the clock input signal is delayed for a time longer than or equal to one quarter of one clock cycle and shorter than or equal to three quarters of one clock cycle, and set the signal of the selection end of the first MUX to '1' when the clock input signal is delayed for a time longer than or equal to zero clock cycle and shorter than one quarter of one clock cycle, or when the clock input signal is delayed for a time longer than three quarters of one clock cycle and shorter than or equal to one clock cycle.

8. A method for eliminating glitches, wherein the method is applied in a digital phase locking loop comprising a delay line and a trigger, and the method comprises:
receiving from a trigger end, by the trigger, a delayed clock signal output by the delay line, and receiving, from an input end, a signal of a selection end of a first delay element in the delay line, wherein the selection end of the first delay element is in a gating state before triggering of the trigger; and
sampling, by the trigger, the signal of the selection end of the first delay element by using the delayed clock signal, and outputting the sampled signal to a selection end of a second delay element in the delay line, wherein the selection end of the second delay element is in the gating state after triggering of the trigger.

9. The method for eliminating glitches according to claim 8, further comprising:
sampling, by a phase detector of the digital phase locking loop by using a received reference signal, the delayed clock signal output by the delay line after triggering of the trigger, obtaining a phase difference between the reference signal and the delayed clock signal, outputting a transition signal according to the phase difference, and controlling, through the transition signal, whether the delay line continues to update an order of delay based on the order of the delay corresponding to the second delay element.

10. The method for eliminating glitches according to claim 8, wherein when the delay elements of the delay line are formed by OR gates or NOR gates, and the digital phase locking loop further comprises a clock processing unit formed by a first NOT gate, a first MUX and an AND gate, the receiving from the trigger end, by the trigger, the delayed clock signal output by the delay line specifically comprises:
receiving, by the first NOT gate, the delayed clock signal output by the delay line, and outputting a signal to a '1' end of the first MUX;
receiving from a '0' end, by the first MUX, the delayed clock signal output by the delay line, receiving from the '1' end, the signal output by the first NOT gate, and outputting a signal to the AND gate;
receiving, by the AND gate, the signal output by the first MUX and a system clock signal, and outputting a signal to the trigger end of the trigger;
receiving from the trigger end, by the trigger, the signal output by the AND gate.

11. The method for eliminating glitches according to claim 8, wherein when the delay elements of the delay line are formed by AND gates or NAND gates or formed by multiplexers MUXs and buffers, and the digital phase locking loop further comprises a clock processing unit formed by a first NOT gate, a first MUX, a second NOT gate and an AND gate, the receiving from the trigger end, by the trigger, the delayed clock signal output by the delay line specifically comprises:
receiving, by the first NOT gate, the delayed clock signal output by the delay line, and outputting a signal to a '1' end of the first MUX;
receiving from a '0' end, by the first MUX, the delayed clock signal output by the delay line, receiving from the '1' end, the signal output by the first NOT gate, and outputting a signal to the AND gate;
receiving, by the second NOT gate, a system clock signal, and outputting a signal to the AND gate;
receiving, by the AND gate, the signal output by the first MUX and the signal output by the second NOT gate, and outputting a signal to the trigger end of the trigger; and receiving from the trigger end, by the trigger, the signal output by the AND gate.

12. The method for eliminating glitches according to claim 10, further comprising:

setting a signal of a selection end of the first MUX to '0' when the clock input signal is delayed for a time longer than or equal to one quarter of one clock cycle and shorter than or equal to three quarters of one clock cycle; and setting the signal of the selection end of the first MUX to '1' when the clock input signal is delayed for a time longer than or equal to zero clock cycle and shorter than one quarter of one clock cycle, or the clock input signal is delayed for a time longer than three quarters of one clock cycle and shorter than or equal to one clock cycle.

13. The method for eliminating glitches according to claim 11, further comprising:

setting a signal of a selection end of the first MUX to '0' when the clock input signal is delayed for a time longer than or equal to one quarter of one clock cycle and shorter than or equal to three quarters of one clock cycle; and setting the signal of the selection end of the first MUX to '1' when the clock input signal is delayed for a time longer than or equal to zero clock cycle and shorter than one quarter of one clock cycle, or the clock input signal is delayed for a time longer than three quarters of one clock cycle and shorter than or equal to one clock cycle.

* * * * *